United States Patent
Frampton

(10) Patent No.: US 8,907,658 B2
(45) Date of Patent: Dec. 9, 2014

(54) SYSTEM AND METHOD OF MEASURING POWER PRODUCED BY A POWER SOURCE

(75) Inventor: Isaac S. Frampton, Strattanville, PA (US)

(73) Assignee: Kohler, Inc., Kohler, WI (US)

( * ) Notice: Subject to any disclaimer, the term of this patent is extended or adjusted under 35 U.S.C. 154(b) by 200 days.

(21) Appl. No.: 13/451,008

(22) Filed: Apr. 19, 2012

(65) Prior Publication Data

US 2013/0278240 A1 Oct. 24, 2013

(51) Int. Cl.
*G01R 11/32* (2006.01)

(52) U.S. Cl.
USPC ............ 324/142; 324/76.11; 702/57; 702/58; 702/59; 702/60

(58) Field of Classification Search
CPC ................................ G01R 21/00; G01R 21/06
USPC ............................ 324/76.11, 142; 702/57–60
See application file for complete search history.

(56) References Cited

U.S. PATENT DOCUMENTS

| | | |
|---|---|---|
| 3,947,762 A | 3/1976 | Hug |
| 3,955,410 A | 5/1976 | Wakabayashi et al. |
| 3,975,952 A | 8/1976 | Lacher, Jr. et al. |
| 4,015,191 A | 3/1977 | Okumura |
| 4,131,847 A | 12/1978 | Kohga et al. |
| 4,174,499 A | 11/1979 | Waurick |
| 4,229,694 A | 10/1980 | Wilson et al. |
| 4,254,376 A | 3/1981 | Steinmiiller |
| 4,291,377 A | 9/1981 | Schneider et al. |
| 4,314,201 A | 2/1982 | Marro et al. |
| 4,341,994 A | 7/1982 | Kawasaki et al. |
| 4,348,638 A | 9/1982 | Boldridge, Jr. |
| 4,356,553 A | 10/1982 | Steinle et al. |
| 4,360,879 A | 11/1982 | Cameron |
| 4,396,986 A | 8/1983 | Salesky |
| 4,492,918 A | 1/1985 | Hernandez et al. |
| 4,525,669 A | 6/1985 | Holberton et al. |
| 4,642,564 A | 2/1987 | Hurley |
| 4,700,188 A | 10/1987 | James |
| 4,713,608 A | 12/1987 | Catiller et al. |
| 4,742,296 A | 5/1988 | Petr et al. |
| 4,764,720 A | 8/1988 | Nystrom |
| 4,774,457 A | 9/1988 | Dunn et al. |
| 4,788,494 A | 11/1988 | Faulkner |
| 4,799,005 A | 1/1989 | Fernandes |
| 4,922,189 A | 5/1990 | Dunn et al. |
| 4,980,634 A | 12/1990 | Mallinson |
| 4,992,725 A | 2/1991 | Komatsu et al. |
| 5,032,785 A | 7/1991 | Mathis et al. |
| 5,079,510 A | 1/1992 | Komatsu et al. |

(Continued)

*Primary Examiner* — Arleen M Vazquez
*Assistant Examiner* — Son Le
(74) *Attorney, Agent, or Firm* — Schwegman Lundberg & Woessner, P.A.

(57) ABSTRACT

Some embodiments relate to a system for measuring power produced by a power source. The system includes a first voltage sensor for sensing a first voltage difference between a first voltage and a second voltage and a second voltage sensor for sensing a second voltage difference between a third voltage and the second voltage. The system further includes a first current sensor for sensing a current difference between a first current and a second current, and a second current sensor for sensing a current difference between a third current and the second current. The system further includes a power measuring device that determines the power produced by the power source using the first and second voltage differences and the first and second current differences.

21 Claims, 4 Drawing Sheets

(56) References Cited

U.S. PATENT DOCUMENTS

| | | | |
|---|---|---|---|
| 5,081,413 A | 1/1992 | Yamada et al. |
| 5,099,195 A | 3/1992 | Greer et al. |
| 5,132,610 A * | 7/1992 | Ying-Chang | ............ 324/142 |
| 5,162,985 A | 11/1992 | Ordines |
| 5,164,660 A | 11/1992 | Carl, Jr. |
| 5,262,715 A | 11/1993 | King et al. |
| 5,305,242 A | 4/1994 | Kikuchi et al. |
| 5,311,117 A | 5/1994 | Komatsu et al. |
| 5,376,880 A | 12/1994 | Nardozza |
| 5,450,007 A | 9/1995 | Payne et al. |
| 5,508,617 A | 4/1996 | Komatsu |
| 5,537,028 A | 7/1996 | Goodwin |
| 5,627,462 A | 5/1997 | Whitehead, Jr. |
| 5,652,505 A | 7/1997 | Brune |
| 5,710,542 A | 1/1998 | Jurisch |
| 6,130,531 A | 10/2000 | Hao |
| 6,356,744 B1 | 3/2002 | Zamat |
| 6,373,238 B2 | 4/2002 | Lewis et al. |
| 6,459,257 B1 | 10/2002 | Kock |
| 6,483,291 B1 | 11/2002 | Bhateja et al. |
| 6,507,184 B1 | 1/2003 | Elston |
| 6,559,630 B2 | 5/2003 | Tsai |
| 6,566,895 B2 | 5/2003 | Estrela et al. |
| 6,617,890 B1 | 9/2003 | Chen et al. |
| 6,771,058 B2 | 8/2004 | Lapinksi et al. |
| 6,788,920 B1 | 9/2004 | Zamat |
| 6,828,771 B1 | 12/2004 | Ghassemi |
| 6,836,105 B2 | 12/2004 | Zou |
| 6,943,538 B2 | 9/2005 | Choi |
| 6,982,650 B1 | 1/2006 | Asplund |
| 6,985,751 B2 | 1/2006 | Bartl et al. |
| 7,026,807 B2 | 4/2006 | Anderson et al. |
| 7,088,967 B2 | 8/2006 | Hildebrand |
| 7,154,077 B2 | 12/2006 | Miklatzky et al. |
| 7,162,379 B2 | 1/2007 | Jang et al. |
| 7,392,021 B2 | 6/2008 | Jain et al. |
| 7,466,145 B2 | 12/2008 | Yanagisawa |
| 7,502,698 B2 | 3/2009 | Uenou et al. |
| 7,511,472 B1 | 3/2009 | Xia et al. |
| 7,622,893 B2 | 11/2009 | Williams |
| 7,683,828 B2 | 3/2010 | Stagliano, Jr. et al. |
| 7,772,829 B2 | 8/2010 | Shuey |
| 7,970,560 B2 | 6/2011 | Rocci et al. |
| 7,991,588 B1 | 8/2011 | Krieger |
| 8,014,964 B1 | 9/2011 | Khalsa |
| 8,027,182 B2 | 9/2011 | Abiko |
| 8,032,316 B2 | 10/2011 | Rocci et al. |
| 8,049,487 B2 | 11/2011 | Myers |
| 8,122,773 B2 | 2/2012 | Wyatt et al. |
| 8,143,881 B2 | 3/2012 | Chen |
| 2003/0058596 A1 * | 3/2003 | MacBeth | ............ 361/93.5 |
| 2011/0068631 A1 | 3/2011 | Roscoe |
| 2012/0242451 A1 | 9/2012 | Tanaka et al. |
| 2013/0073126 A1 | 3/2013 | Kumar et al. |

* cited by examiner

SYSTEM AND METHOD OF MEASURING POWER PRODUCED BY A POWER SOURCE

TECHNICAL FIELD

Embodiments pertain to a system and method of measuring power produced by a power source, and more particularly to a system and method of measuring power produced by a power source using measured currents and voltages.

BACKGROUND

FIG. 1 illustrates an example 2-element prior art power measurement system 100. The power measurement system 100 includes a first voltage measuring element 101A and a second voltage measuring element 101B. First voltage measuring element 101A measures the voltage difference between phase A voltage Va and phase B voltage Vb. Second voltage measuring element 101B measures the voltage difference between phase C voltage Vc and phase B voltage Vb.

The power measurement system 100 includes a first current measuring element 102A and a second current measuring element 102B. First current measuring element it 102A measures the phase A current Ia. Second current measuring element 102B measures the phase C current Ic.

One of the drawbacks with using 2-element prior art power measurement system is that the power measurement system 100 is unable to accurately measure power on an unbalanced load L (i.e., when the phase A current Ia is not equal to the phase B current Ib or is not equal to the phase C current Ic).

FIG. 2 illustrates an example 3-element prior art power measurement system 200. The power measurement system 200 includes a first voltage measuring element 201A, a second voltage measuring element 201B and a third voltage measuring element 201C. First voltage measuring element 201A measures the phase A voltage Va. Second voltage measuring element 201B measures the phase B voltage Vb. Third voltage measuring element 201C measures the phase C voltage Vc.

The power measurement system 200 includes a first current measuring element 202A, a second current measuring element 202B and a third current measuring element 202C. First current measuring element 202A measures the phase A current Ia. Second current measuring element 202B measures the phase B current Ib. Third current measuring element 202C measures the phase C current Ic.

One of the drawbacks with using 3-element prior art power measurement system 200 is that the power measurement system 200 requires three voltage transformers and three current transformers. The power measurement system 200 also requires three voltage measuring channels and three current measuring channels. Therefore, there is added cost associated with utilizing the power measurement system 200.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
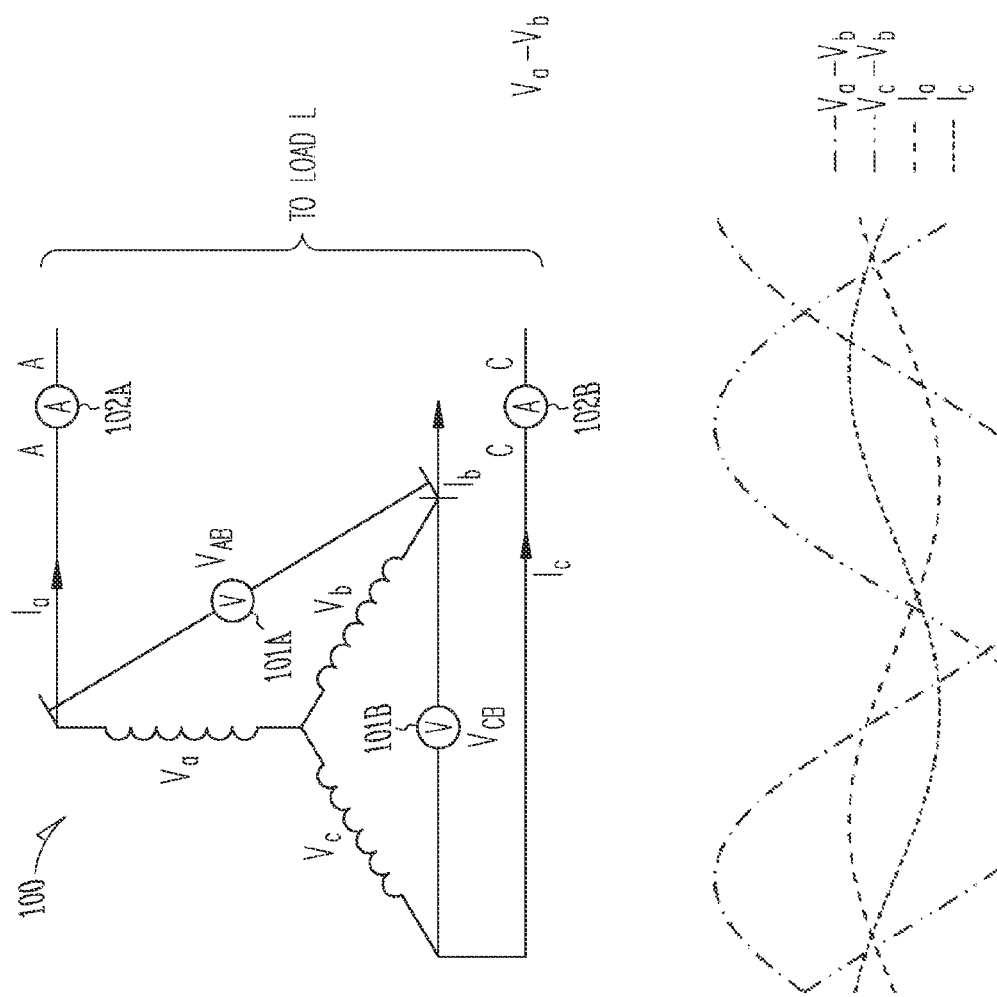
FIG. 1 illustrates an example 2-element prior art power measurement system.
Figure 2:
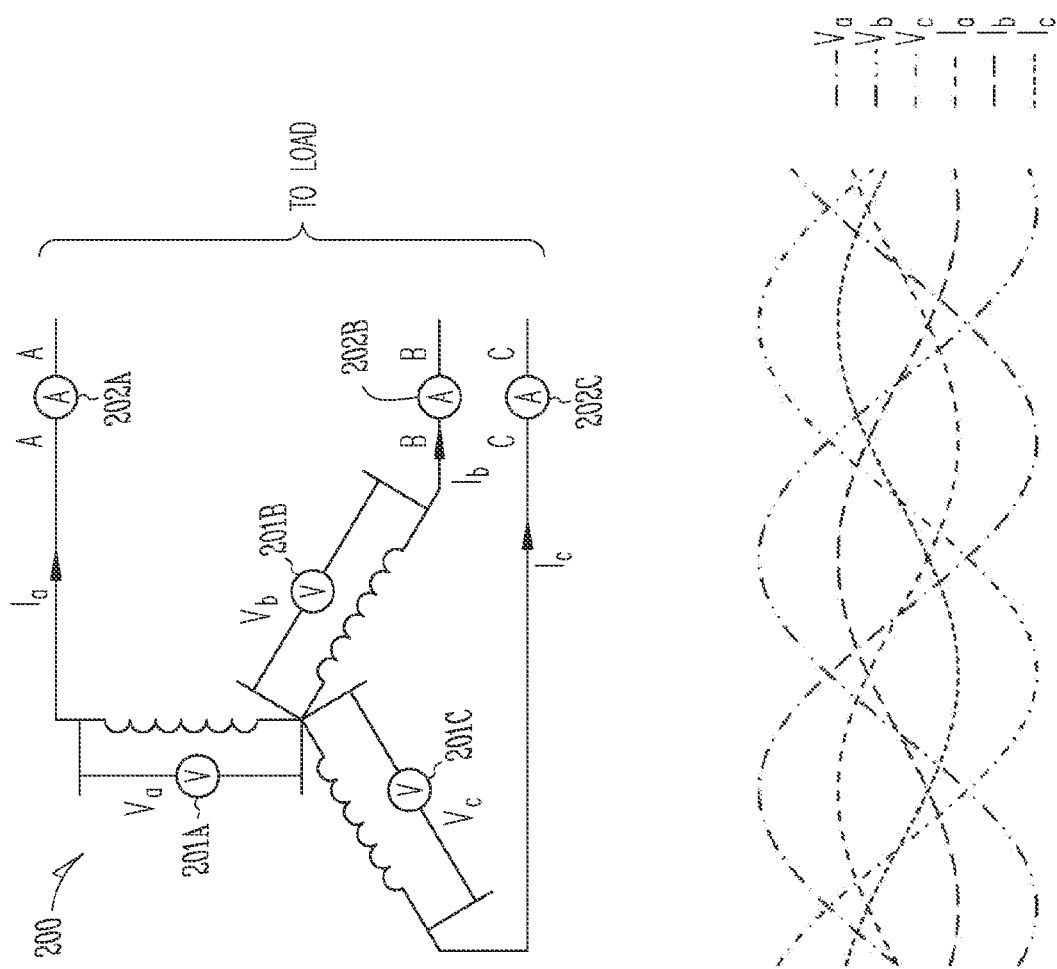
FIG. 2 illustrates an example 3-element prior art power measurement system.
Figure 3:
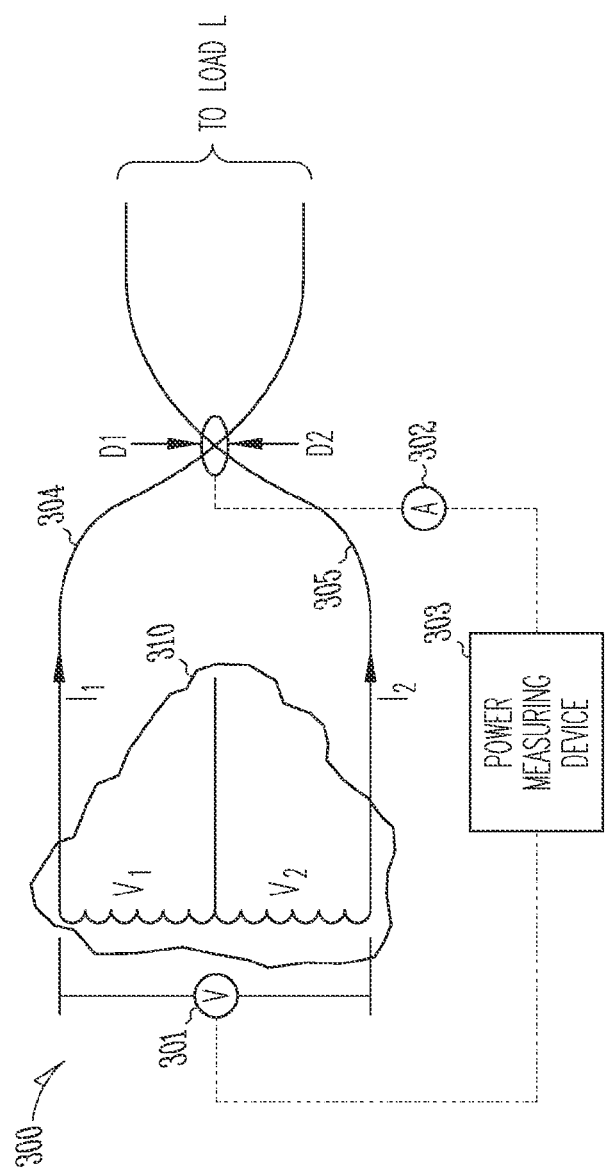
FIG. 3 illustrates an example single-phase power measurement system.
Figure 3:
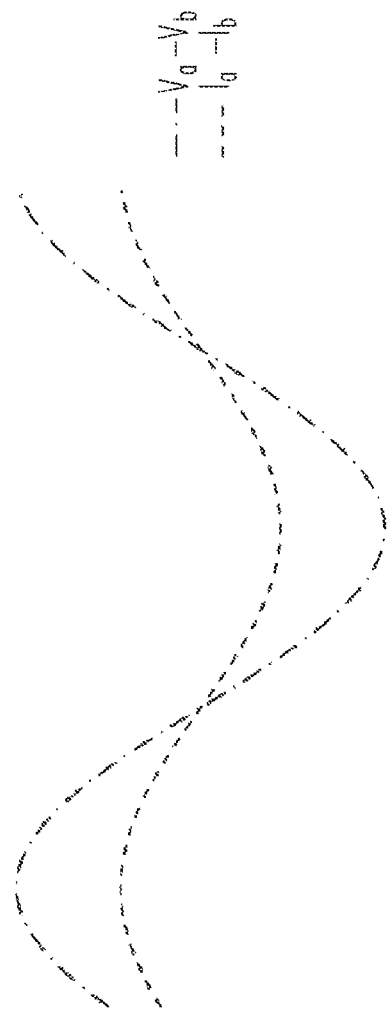

FIG. 3 illustrates an example system 300 for measuring power produced by a power source 310 (e.g., a single-phase power source). The system 300 includes a voltage sensor 301 for sensing a voltage difference between a first voltage V1 and a second voltage V2. The system 300 further includes a current sensor 302 for sensing a current difference between a first current I1 and a second current I2. A power measuring device 303 determines the power produced by the power source 300 using the voltage difference sensed by the voltage sensor 301 and the current difference sensed by the current sensor 302.

In some embodiments, the voltage sensor 301 measures the first voltage V1 and measures the second voltage V2 and the voltage sensor 301 subtracts the second voltage V2 from the first voltage V1 to determine the voltage difference. In other embodiments, the voltage sensor 301 directly measures the voltage difference between the first voltage V1 and the second voltage V2.

In some embodiments, the current sensor 302 measures the first current I1 and measures the second current I2 and the current sensor 302 subtracts the second current I2 from the first current to determine the current difference. In other embodiments, the current sensor 302 directly measures the current difference between the first current I1 and the second current I2 (see, e.g., FIG. 3).

In the example embodiment that is illustrated in FIG. 3, a first conductor 304 carries the first current I1 and a second conductor 305 carries the second current I2. In addition, the illustrated current sensor 302 is a current transformer such that the first conductor 304 extends through the current transformer 302 and carries the first current in one direction D1, and the second conductor 305 extends through the current transformer 302 and carries the second current I2 in an opposite direction D2. The size and shape of the first and second conductors 304, 305 and the current transformer 302 will depend in part on the amount of power that will be sensed using the system 300.

Figure 4:
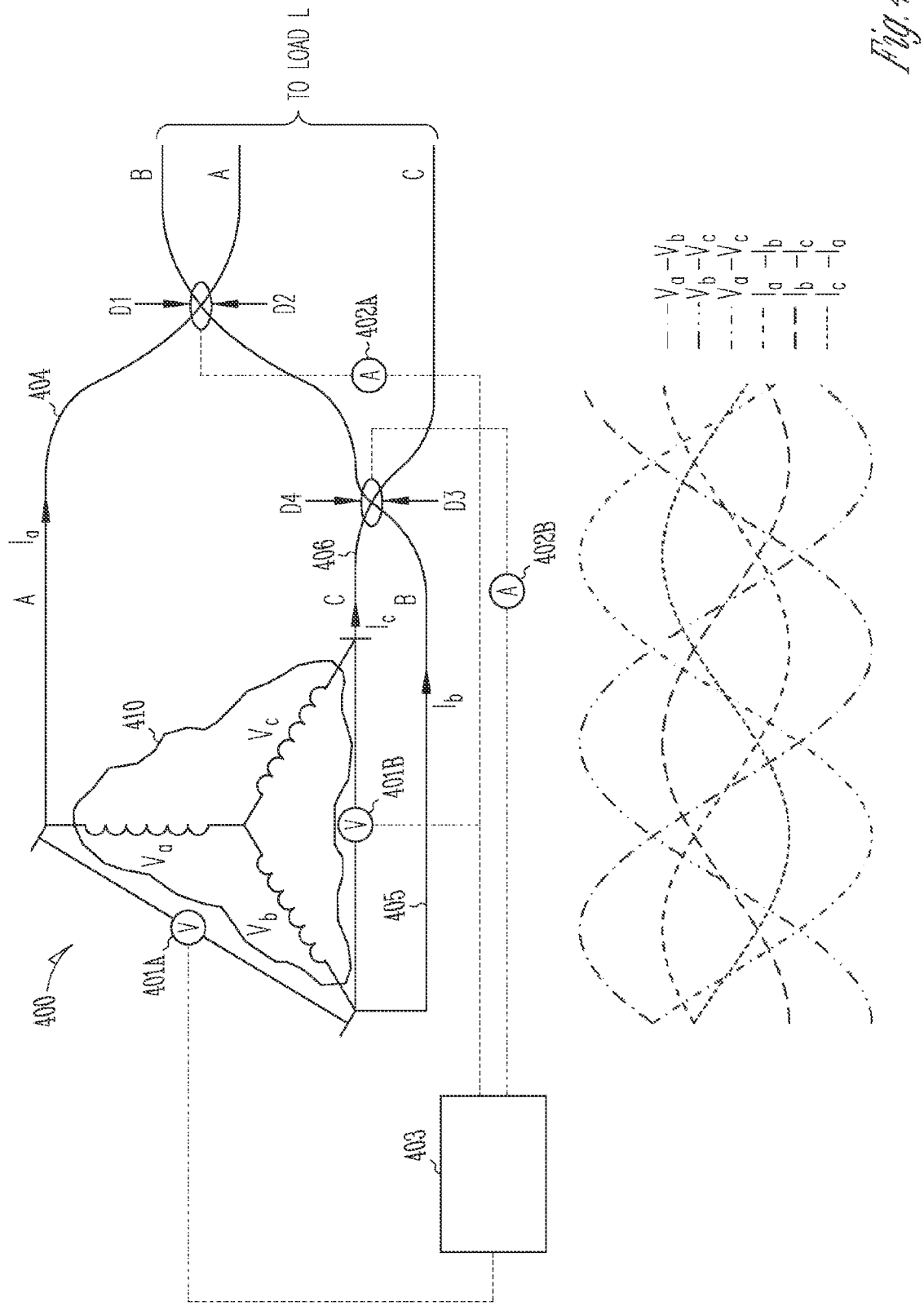
FIG. 4 illustrates an example three-phase power measurement system.

FIG. 4 illustrates an example system 400 for measuring power produced by a power source 410 (e.g., a three-phase power source). The system 400 includes a first voltage sensor 401A for sensing a first voltage difference between a first voltage Va and a second voltage Vb and a second voltage sensor 401B for sensing a second voltage difference between a third voltage Vc and the second voltage Vb.

The system 400 further includes a first current sensor 402A for sensing a current difference between a first current Ia and a second current Ib, and a second current sensor 402B for sensing a current difference between a third current and the second current Ib. The system 400 further includes a power measuring device 403 that determines the power supplied by the power source 410 using the first and second voltage differences and the first and second current differences.

In the example embodiment that is illustrated in FIG. 4, system 400 further includes (i) a first conductor 404 that carries the first current Ia; (ii) a second conductor 405 that carries the second current Ib; and (iii) a third conductor 406 that carries the third current Ic. As an example, the illustrated first current sensor 402A may be a first current transformer such that the first conductor 404 extends through the first current transformer 402A and carries the first current in one direction D1, and the second conductor 405 extends through the first current transformer 402A and carries the second current in an opposite direction D2. In addition, the second current sensor 402B may be a second current transformer such that the second conductor 405 extends through the second current transformer 402B and carries the second current Ib in one direction D3 and the third conductor 406 extends through the second current transformer 402B and carries the third current Ic in an opposite direction D4.

It should be noted that other embodiments are contemplated where the power measuring device 403 (i) calculates a third voltage difference using the first and second voltage differences; and (ii) calculates a third current difference using the first and second current differences. The power measuring device 403 then determines the power produced by the power source 410 using the first, second and third voltage differences and the first, second and third current differences.

A method of measuring power produced by a power source 310 will now be described with reference to FIG. 3. The method includes measuring a voltage difference between a first voltage V1 and a second voltage V2 and measuring a current difference between a first current I1 and a second current I2. The method further includes calculating power produced by a power source 310 using the voltage difference and the current difference.

In some embodiments, measuring a voltage difference between the first voltage V1 and the second voltage V2 includes (i) measuring a first voltage V1; (ii) measuring second voltage V2; and (iii) calculating the voltage difference by subtracting the second voltage V2 from the first voltage V1. In other embodiments, measuring a voltage difference between the first voltage V1 and the second voltage V2 includes directly measuring the voltage difference.

In some embodiments, measuring a current difference between the first current I1 and the second current I2 includes (i) measuring a first current I1; (ii) measuring a second current I2; and (iii) calculating the current difference by subtracting the second current I2 from the first current I1. In other embodiments, measuring a current difference between the first current I1 and the second current I2 includes directly measuring the current difference. Embodiments are contemplated where calculating power produced by a power source 410 includes using the voltage difference and the current difference to obtain of an average of the product of the voltage difference and current difference over a period of time.

A method of measuring power produced by a power source 410 will now be described with reference to FIG. 4. The method includes measuring a first voltage difference between a first voltage Va and a second voltage Vb, and measuring a second voltage difference between a third voltage Vc and the second voltage Vb. The method further includes determining a third voltage difference by using the second voltage difference and the first voltage difference.

In an example embodiment, the third voltage difference may be calculated by subtracting the second voltage difference from the first voltage difference (i.e., (Va−Vb)−(Vc−Vb)=(Va−Vc)).

The method further includes measuring a first current difference between a first current Ia and a second current Ib, and measuring a second current difference between a third current Ic and the second current Ib. The method further includes determining a third current difference by using the second current difference and the first current difference.

In an example embodiment, the third current difference may be calculated by subtracting the second current difference from the first current difference (i.e., (Ia−Ib)−(Ic−Ib)=(Ia−Ic)).

The method also includes calculating power produced by the three-phase power source 410 using the first, second and third voltage differences and the first, second and third current differences. In some embodiments, determining a third voltage difference by using the second voltage difference and the first voltage difference includes subtracting the second voltage difference from the first voltage difference; and/or determining a third current difference by using the second current difference and the first current difference includes subtracting the second current difference from the first current difference.

The systems and methods described herein may be able to accurately measure power on an unbalanced load L (i.e., when the phase A current is not equal to the phase B current or is not equal to the phase C current). In addition, the systems and methods described herein may be able to accurately measure power using only two current transformers and two voltage transformers.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A system for measuring power produced by a three-phase power source, the system comprising:
    a voltage sensor for sensing a voltage difference between a first voltage corresponding to a first phase and a second voltage corresponding to a second phase;
    a current sensor for sensing a current difference between a first current corresponding to the first phase and a second current corresponding to either the second phase or a third phase; and
    a power measuring device that determines the power produced by the three-phase power source using the voltage difference sensed by the voltage sensor and the current difference sensed by the current sensor.

2. The system of claim 1 wherein the voltage sensor measures the first voltage and measures the second voltage, and wherein the voltage sensor subtracts the second voltage from the first voltage to determine the voltage difference.

3. The system of claim 1 wherein the voltage sensor directly measures the voltage difference between the first voltage and the second voltage.

4. The system of claim 1 wherein the current sensor measures the first current and measures the second current, and wherein the current sensor subtracts the second current from the first current to determine the current difference.

5. The system of claim 1 wherein the current sensor directly measures the current difference between the first current and the second current.

6. The system of claim 5 further comprising a first conductor that carries the first current and a second conductor that carries the second current.

7. The system of claim 6 wherein the current sensor is a current transformer such that the first conductor extends through the current transformer and carries the first current in one direction and the second conductor extends through the current transformer and carries the second current in an opposite direction.

8. A system for measuring power produced by a power source, the system comprising:
    a first voltage sensor for sensing a first voltage difference between a first voltage and a second voltage;
    a second voltage sensor for sensing a second voltage difference between the second voltage and a third voltage;

a first current sensor for sensing a current difference between a first current and a second current;

a second current sensor for sensing a current difference between the second current and a third current; and a power measuring device that determines the power produced by the power source using the first and second voltage differences and the first and second current differences.

9. The system of claim 8 further comprising:

a first conductor that carries the first current;

a second conductor that carries the second current; and a third conductor that carries the third current.

10. The system of claim 9 wherein the first current sensor is a first current transformer such that the first conductor extends through the first current transformer and carries the first current in one direction and the second conductor extends through the first current transformer and carries the second current in an opposite direction, and wherein the second current sensor is a second current transformer such that the second conductor extends through the second current transformer and carries the second current in one direction and the third conductor extends through the second current transformer and carries the third current in an opposite direction.

11. The system of claim 8 wherein the power measuring device that determines the power produced by the power source calculates a third voltage difference using the first and second voltage differences and calculate a third current difference using the first and second current differences; and wherein the power measuring device determines the power produced by the power source using the first, second and third voltage differences and the first, second and third current differences.

12. The system of claim 8 wherein the power source is a three-phase power source.

13. A method of measuring power produced by a three-phase power source comprising:

measuring a voltage difference between a first line voltage corresponding to a first phase and a second line voltage corresponding to a second phase;

measuring a current difference between a first line current corresponding to the first phase and a second line current corresponding to the second phase or a third phase; and calculating power produced by the three phase power source using the voltage difference and the current difference.

14. The method of claim 13 wherein measuring a voltage difference between the first line voltage and the second line voltage includes:

measuring a first voltage;

measuring second voltage; and calculating the voltage difference by subtracting the second voltage from the first voltage.

15. The method of claim 13 wherein measuring a voltage difference between the first line voltage and the second line voltage includes directly measuring the voltage difference.

16. The method of claim 13 wherein measuring a current difference between the first line current and the second line current includes:

measuring a first current;

measuring a second current; and calculating the current difference by subtracting the second current from the first current.

17. The method of claim 13 wherein measuring a current difference between the first line current and the second line current includes directly measuring the current difference.

18. The method of claim 13 wherein calculating power produced by a power source using the voltage difference and the current difference includes obtaining of an average of the product of the voltage difference and current difference over a period of time.

19. A method of measuring power produced by a three-phase power source comprising:

measuring a first voltage difference between a first line voltage and a second line voltage;

measuring a second voltage difference between the second voltage and a third line voltage;

determining a third voltage difference by using the second voltage difference and the first voltage difference;

measuring a first current difference between a first line current and a second line current;

measuring a second current difference between the second line current and a third line current and determining a third current difference by using the second current difference and the first current difference; and calculating power produced by the three-phase power source using the first, second and third voltage differences and the first, second and third current differences.

20. The method of claim 19 wherein determining a third voltage difference by using the second voltage difference and the first voltage difference includes subtracting the second voltage difference from the first voltage difference.

21. The method of claim 19 wherein determining a third current difference by using the second current difference and the first current difference includes subtracting the second current difference from the first current difference.

* * * * *